United States Patent
Ma et al.

(10) Patent No.: US 6,759,695 B2
(45) Date of Patent: Jul. 6, 2004

(54) INTEGRATED CIRCUIT METAL OXIDE SEMICONDUCTOR TRANSISTOR

(75) Inventors: Yanjun Ma, Seattle, WA (US); Douglas James Tweet, Camas, WA (US); David Russell Evans, Beaverton, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/661,429

(22) Filed: Sep. 11, 2003

(65) Prior Publication Data

US 2004/0077136 A1 Apr. 22, 2004

Related U.S. Application Data

(62) Division of application No. 10/072,248, filed on Feb. 7, 2002, now Pat. No. 6,620,664.

(51) Int. Cl.⁷ .............................................. H01L 29/788
(52) U.S. Cl. ....................................................... 257/192
(58) Field of Search .................................. 257/192, 616

(56) References Cited

U.S. PATENT DOCUMENTS 6,310,367 B1 * 10/2001 Yagishita et al. ........... 257/190
6,313,486 B1 * 11/2001 Kencke et al. .............. 257/192

* cited by examiner

*Primary Examiner*—David Nelms
*Assistant Examiner*—Quoc Hoang
(74) *Attorney, Agent, or Firm*—David C. Ripma; Matthew D. Rabdau

(57) ABSTRACT

An integrated circuit metal oxide semiconductor device comprises a gate region and a dielectric layer positioned therein, wherein the dielectric layer is substantially free of germanium diffused therein from a silicon germanium layer of the device. The method comprises depositing a dummy replacement gate, subjecting the device to high temperature processing, removing the dummy gate, and then depositing a dielectric material and a final gate material within the formed gate region. Because the dielectric material is deposited after high temperature processing of the device, there is negligible diffusion of germanium into the dielectric material.

7 Claims, 5 Drawing Sheets

INTEGRATED CIRCUIT METAL OXIDE SEMICONDUCTOR TRANSISTOR

CROSS REFERENCE TO RELATED APPLICATION

This application is a divisional of application Ser. No. 10/072,248, filed Feb. 7, 2002, entitled "Silicon-Germanium MOSFET with Deposited Gate Dielectric and Metal Gate Electrode and Method for Making the Same," invented by Ma et al., now U.S. Pat. No. 6,620,664.

FIELD OF THE INVENTION

This invention relates to integrated circuit metal oxide semiconductor transistors and a method of manufacturing the same and, more particularly, to a gate replacement process conducted after high temperature treatment of the device so as to minimize diffusion of germanium in the gate dielectric material.

BACKGROUND OF THE INVENTION

Integrated circuit metal oxide semiconductor field effect transistors (MOSFETs) include silicon germanium ($Si_{1-x}Ge_x$) channels have been widely reported. A thin silicon cap layer usually is deposited on the SiGe layer. This silicon cap acts to prevent the diffusion of germanium into the silicon dioxide gate dielectric material, separates the hole channel from the gate dielectric in strained SiGe p-type metal oxide semiconductor field effect transistors (pMOSFETs), and forms a high-mobility electron or hole channel in strained-Si MOSFETs.

In enhanced mobility MOSFET device applications, thick, relaxed $Si_{1-x}Ge_x$ buffer layers have been used as virtual substrates for thin, tensile-strained Si layers to increase carrier mobility for both NMOS and PMOS devices. Compared with bulk Si devices, enhancement in electron mobility of 70% for devices with an effective length less than 70 nanometers (nm) has been reported. Enhancements of up to 40% in high-field hole mobility for long-channel devices have also been found. The most popular, current technique to produce a high quality relaxed $Si_{1-x}Ge_x$ buffer layer is the growth of a several micrometers thick compositionally graded layer. Alternatively, both Helium and Hydrogen implantation followed by annealing have been reported as methods to improve the efficiency of relaxation.

Yet another device structure includes growing a thin, strained SiGe layer followed by a thin, relaxed Si layer. This structure improves PMOS mobilities, but does not help NMOS.

Regardless of the thickness or strained/unstrained state of the individual layers of these prior art devices, a disadvantage of each these prior art processes is that the device is subjected to high temperature processing after formation of the silicon cap layer. In other words, regardless of whether the SiGe is thick or thin, strained or relaxed, it is critical to minimize the diffusion of Ge into the overlying Si cap/channel during subsequent process steps. In particular, during the subsequent gate oxidation, the gate polysilicon deposition and the dopant activation, there invariably will be diffusion of the germanium into the silicon dioxide gate dielectric material. This diffusion of germanium into the gate dielectric material causes degradation of device performance.

Accordingly, there is a need for a device and a method of fabricating the same wherein diffusion of germanium into the gate dielectric is reduced or eliminated.

SUMMARY OF THE INVENTION

The present invention provides a device and a method of fabricating the same, wherein the method comprises combining the use of a deposited gate dielectric and a metal gate in a gate replacement process within the SiGe channel. Because the gate dielectric is deposited after all of the high temperature treatments on the device, there is negligible diffusion of the germanium into the gate dielectric material.

Accordingly, an object of the invention is to provide an integrated circuit metal oxide semiconductor device having reduced germanium in the gate dielectric material.

Another object of the invention is to provide a method of fabricating an integrated circuit metal oxide semiconductor device having reduced germanium in the gate dielectric material.

A further object of the invention is to provide a method of fabricating an integrated circuit metal oxide semiconductor device having reduced germanium in the gate dielectric material wherein the gate dielectric material is deposited after the device has undergone all of the high temperature treatments.

DETAILED DESCRIPTION OF THE PREFERRED EMBODIMENTS

Figure 1:
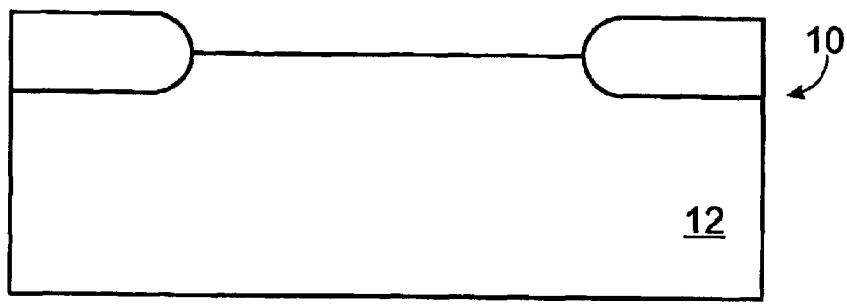
FIG. 1 is a side cross sectional view of a first embodiment of the device including n-well and p-well formation.

Turning now to the drawings, FIG. 1 shows a side cross sectional view of a first embodiment of the device including n-well, p-well and device isolation. In particular, device 10 comprises an n-silicon substrate 12 including isolated active transistor regions. The active regions are fabricated by any state of the art process. Device isolation is also conducted, as known in the art. The example shown in these fabrication steps comprises a p-channel MOS transistor. However, the same process, with proper replacement in the silicon dopant, as should be understood by those skilled in the art, is applicable to n-channel transistors and for CMOS integrated circuit (IC) fabrication.

Figure 2:
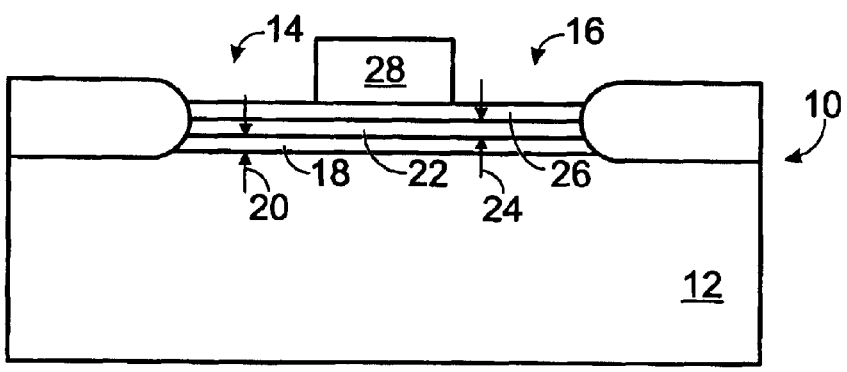
FIG. 2 is a side cross sectional view of the device of FIG. 1 after photolithography and anisotropic etching of the dummy gate, stopping at the gate oxide.

FIG. 2 shows a side cross sectional view of the device after photolithography and anisotropic etching of the dummy gate, stopping at the gate oxide. In particular, the device shown in FIG. 1 is selectively deposited with an epitaxial $Si_{1-x}Ge_x$ alloy, wherein x typically is in a range of 0.05 to 1.00 or contains a concentration gradient, and wherein the epitaxial layer may be strained and thin (typically 2 nm to 50 nm) or relaxed and thick (typically 200 nm to 5 $\mu$m). A silicon cap layer is then deposited, typically having a thickness in a range of 3 to 30 nm. The silicon cap layer may be strained if deposited on a relaxed SiGe layer or relaxed if deposited on a strained SiGe layer. Dummy gate oxidation is then performed, followed by the deposition of a dummy gate, which may comprise polysilicon, polysilicon germanium, silicon nitride or the like. After deposition of the dummy gate, photolithography and anisotropic plasma etching of the dummy gate is performed, stopping at the gate oxide. The photoresist is then stripped from the device.

After these process steps device 10 comprises, in one example, source region 14, drain region 16, and a $Si_{1-x}Ge_x$ alloy layer 18, wherein x is in a range of 0.05 to 1.0, and wherein layer 18 has a thickness 20 in a range of 2 nm to 5 $\mu$m. A silicon cap layer 22 is positioned on silicon germanium layer 18, wherein the silicon cap layer typically has a thickness 24 in a range of 3 to 30 nm. A dummy gate oxide layer 26 is positioned on silicon cap layer 22. A dummy gate 28 is positioned on oxide layer 26.

Figure 3:
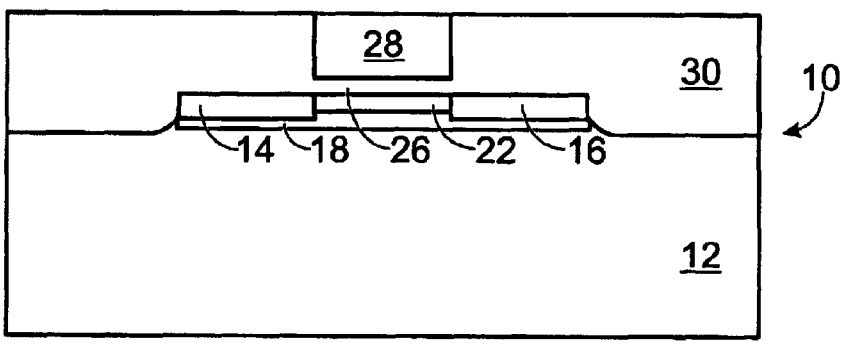
FIG. 3 is a side cross sectional view of the device of FIG. 2 after preparation of the source and drain, and exposure of the dummy gate.

FIG. 3 shows a side cross sectional view of the device after preparation of the source and drain, and exposure of the dummy gate. There are several methods for preparing the source and the drain, including conventional lightly doped drain (LDD) processing, raised source/drain formation, and plasma doping. These processes are well known in the art. A silicide is also formed by conventional processing. A chemical vapor deposition (CVD) oxide fill is then performed. The desired thickness is approximately 1.5 to 2.0 times the thickness of the dummy gate layer deposited earlier. The wafer is then planarized by chemical mechanical polishing (CMP) to expose the dummy gate. After these process steps, device 10 comprises source region 14, drain region 16, silicon germanium layer 18, silicon cap 22, oxide layer 26, dummy gate 28, and oxide layer 30. In this example, substrate 12 is n-type silicon and the source and drain regions are P+type.

Figure 4:
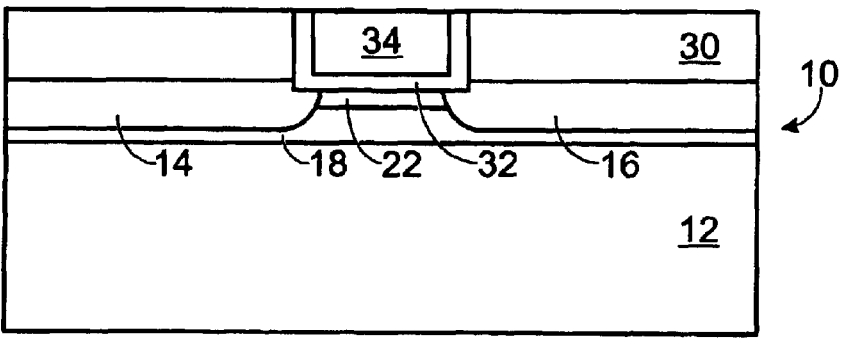
FIG. 4 is a side cross sectional view of the proposed device of FIG. 3 in final form including a replacement gate.

FIG. 4 shows a side cross sectional view of the proposed device in final form. Although a p-channel MOS transistor is used as an example, the structure and fabrication process is applicable to n-channel MOS transistors and CMOS integration. The process steps are as follows. The dummy gate is removed by a highly selective etch. In one example, wherein the dummy gate is manufactured of a nitride, the dummy gate is removed by an etch utilizing hot phosphoric acid. In the case where the dummy gate is polysilicon, a highly selective HBr plasma etch, a KOH etch, or an ammonium hydroxide etch, or the like, may be used. Care must be taken when removing the dummy gate oxide so as to leave a well-controlled silicon cap thickness on top of the silicon germanium channel. In particular, a silicon cap thickness of approximately 3–30 nm should remain on the device after removal of the dummy gate. As an example, the oxide may be removed with a HF etch, a HF dip, a HF vapor, or any similar type etching process.

The gate dielectric is then deposited, which may include the use of deposited high dielectric constant materials such as tantalum oxide ($Ta_2O_5$), titanium oxide ($TiO_2$) zirconium oxide ($ZrO_2$), lanthanum oxide ($La_2O_3$), hafnium oxide ($HfO_2$), yttrium oxide ($Y_2O_3$), and their silicates, and other such materials. Because the dielectric layer is deposited after the high temperature thermal processing steps on the device have been completed, the dielectric layer is substantially free from germanium diffused into the dielectric layer from the silicon germanium layer. By "substantially free of germanium," or a "negligible amount of germanium," Applicants mean that the dielectric layer of the final device includes less than one (1.0) % germanium. The remainder of the process proceeds as described in the issued patent to Sheng Teng Hsu and David Russell Evans, entitled Fabrication of a Planar MOSFET with Raised Source/Drain by Chemical Mechanical Polishing and Nitride Replacement, filed Feb. 23, 1998, issued Oct. 17, 2000, having U.S. Pat. No. 6,133,106, and which is herein incorporated by reference in its entirety. For conventional polysilicon gate fabrication, standard processing as known in the art is conducted.

After these process steps, device 10 as completed comprises source region 14, drain region 16, silicon germanium layer 18, silicon cap 22, a high dielectric constant material layer 32, a metal gate 34, and oxide layer 30. Dielectric layer 32 typically has a thickness in a range of zero (0) to 100 nm. Metal gate 34 and dielectric constant material 32 are substantially free of germanium diffused therein from layer 18 because metal gate 34 and dielectric constant material 32 were deposited after the high temperature processing steps of the device had already been completed. Accordingly, performance of completed device 10 is not degraded by diffused germanium so that the device has high performance characteristics. In particular, device 10 typically has a drive current that is greater than or equal to a similar device fabricated without the SiGe epitaxial layer.

Figure 5:
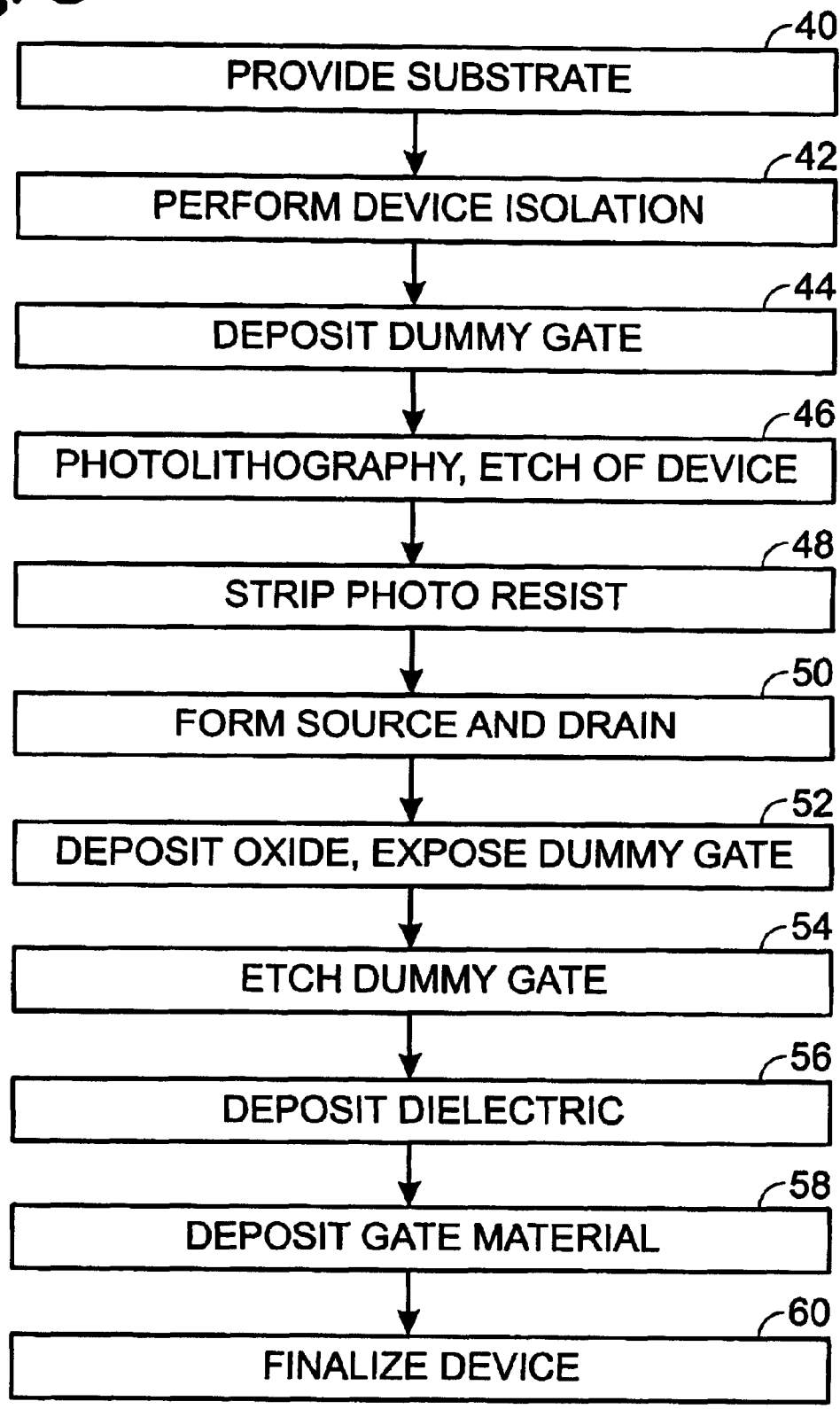
FIG. 5 is a flowchart of the method of the present invention.

FIG. 5 shows a flowchart of one method of the present invention. In particular, step 40 comprises providing an integrated circuit substrate as known in the art. Step 42 comprises performing n-well, p-well and device isolation. Step 44 comprises depositing a dummy gate. Step 46 comprises conducting photolithography and anisotropic plasma etching of the dummy gate, stopping at the gate oxide. Step 48 comprises stripping the photoresist. Step 50 comprises forming the source and drain regions. Step 52 comprises depositing an oxide layer and planarizing the wafer to expose the dummy gate. Step 54 comprises removing the dummy gate by etching. This step marks the end of all high temperature thermal steps to which the device is subjected. In particular, the high temperature thermal processing steps typically include subjecting the device to temperatures greater than 700 degrees Celsius for a time period greater than one second. Step 56 comprises depositing a dielectric in the gate region. Step 58 comprises depositing the final gate material in the gate region. Step 60 comprises finalizing the device by well known process steps, such as providing contacts on the device.

Figure 6:
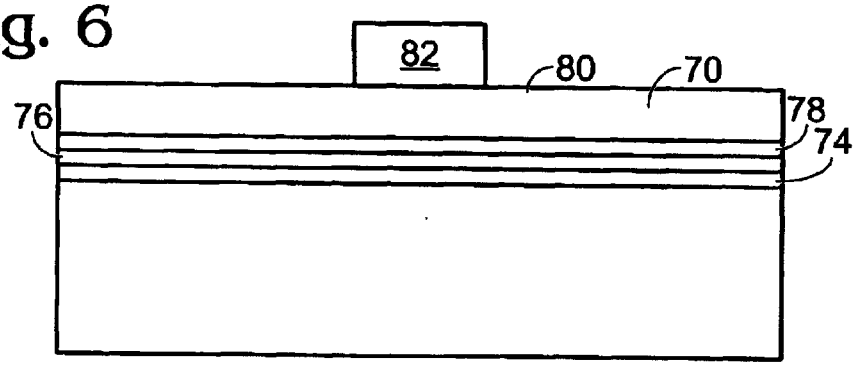
FIG. 6 is a side cross sectional view of another embodiment of the device including a dummy polysilicon layer and photoresist positioned over the gate region.

FIG. 6 is a side cross sectional view of another embodiment of the device including a dummy polysilicon layer and photoresist positioned over the gate region. In particular, device 70 includes a substrate 72 having thereon a SiGe epitaxial layer 74, a silicon cap layer 76, a gate oxide layer 78, a dummy polysilicon layer 80, and a gate photoresist 82. Silicon germanium layer 74 could be thick, e.g., 200 nm to 5 μm and relaxed, or thin, e.g., 2 to 50 nm and strained. The germanium concentration may be any value from zero to 100%, or the SiGe layer may contain a concentration gradient. If the SiGe layer is relaxed, the Si cap layer 76 will be under tensile strain. If the SiGe layer is strained to be lattice-matched to the Si substrate, then the Si cap layer 76 will be relaxed. The Si cap layer 76 typically is approximately 3–30 nm thick.

After the SiGe and Si cap layers have been formed on the substrate, any known process may be used to form the n-well and p-wells. After these process steps, shallow trench isolation is conducted. First, the dummy gate oxide layer 78 and the dummy gate layer 80 are deposited. The dummy gate layer typically is polysilicon, polysilicon-germanium, or siliconnitride. After deposition of the dummy oxide and dummy gate layers, photoresist 82 is applied and patterned in preparation for the shallow trench isolation. As shown in FIG. 6, photoresist 82 is shown covering the gate region of the device.

Figure 7:
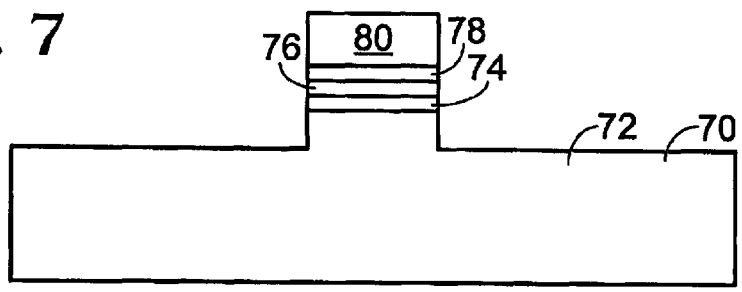
FIG. 7 is a side cross sectional view of the device of FIG. 6 after photolithography and anisotropic etching of the dummy gate.

FIG. 7 is a side cross sectional view of the device of FIG. 6 after photolithography and anisotropic etching of the dummy gate. In particular, the device of FIG. 6 is subjected to anisotropic plasma etching of the dummy gate, the gate oxide, the Si cap layer, the SiGe layer, and into the Si substrate, if required. The photoresist is then stripped from the gate region.

Figure 8A:
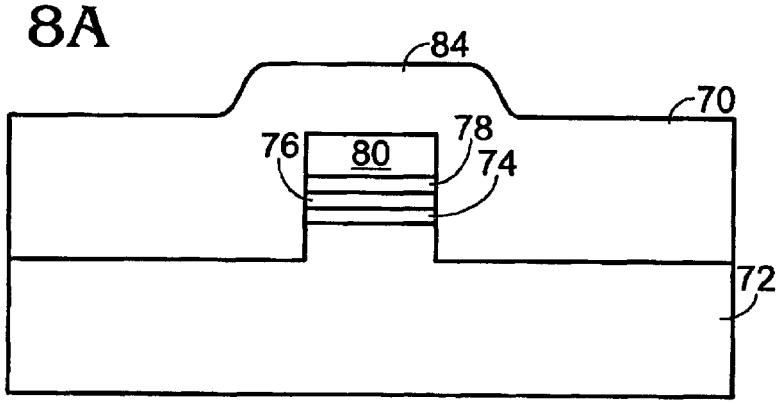
FIGS. 8A and 8B are side cross sectional views of the device after PECVD and HDP oxide deposition, respectively.
Figure 8B:
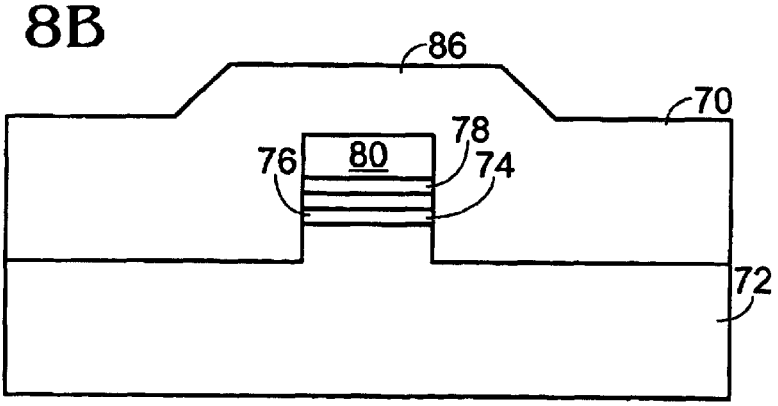

FIGS. 8A and 8B are side cross sectional views of the device after plasma enhanced chemical vapor deposition (PECVD) and high density plasma (HDP) oxide deposition, respectively. In particular, in FIG. 8A, a PECVD process is used to deposit a PECVD oxide layer 84 over the device. In FIG. 8B, a HDP process is used to deposit a HDP oxide layer 86 over the device.

Figure 9:
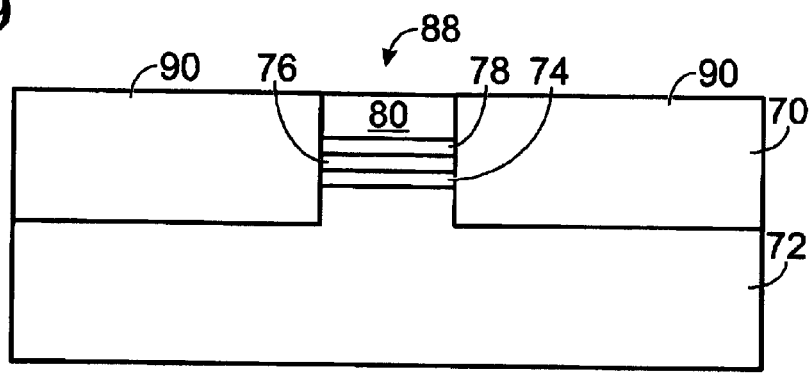
FIG. 9 is a side cross sectional view of the device of FIG. 8 after chemical mechanical polishing.

FIG. 9 is a side cross sectional view of the device of FIG. 8 after chemical mechanical polishing (CMP). The CMP process is stopped at the dummy gate so that the device includes an exposed gate region 88 and an oxide layer 90 over the remainder of the device of FIG. 8.

Figure 10:
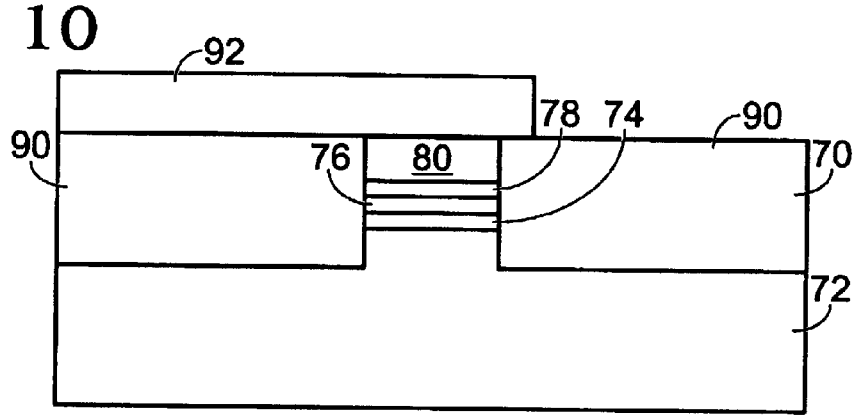
FIG. 10 is a side cross sectional view of the device of FIG. 9 after deposition of a dummy gate material.

FIG. 10 is a side cross sectional view of the device of FIG. 9 after deposition of a second dummy gate layer. The second dummy gate layer is patterned with photoresist and etched to cover gate region 88. In particular, device 70 includes second dummy gate layer 92 positioned on device 70 so as to completely cover gate region 88 and so as to be in contact with dummy gate layer 80. Second dummy gate layer 92 may comprise polysilicon, polysilicon-germanium, or siliconnitride, but typically will be the same material used to deposit dummy gate layer 80. In the example shown, both dummy gate layers 80 and 92 are polysilicon. This process step marks the end of the shallow trench isolation. The device is now ready for replacement of the dummy gate.

Figure 11:
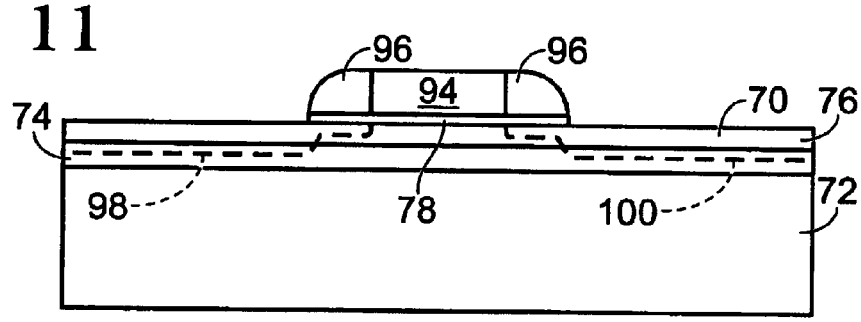
FIG. 11 is a side cross sectional view of the device of FIG. 10 after source, drain and spacer formation.

FIG. 11 is a side cross sectional view of the device of FIG. 10 after source, drain and spacer formation. Gate layer 94 comprises gate material 80 and a portion of gate material 92. Source 98 and drain 100 formation may be conducted by any known process, such as: conventional lightly doped drain (LDD) implantation; raised source/drain formation; and plasma doping. The spacers are formed using any conventional process. A silicide may also be formed by any conventional process, as taught, for example, by Maa et al. in U.S. Pat. Nos. 6,071,782 and 5,830,775. For convenience, the view of FIG. 11 is rotated ninety degrees from the previous figures and for simplicity, the shallow trench isolation of the previous figures is not shown.

Figure 12:
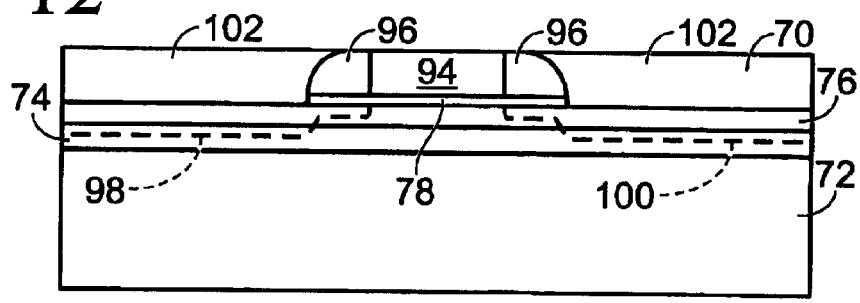
FIG. 12 is a side cross sectional view of the device of FIG. 11 after a chemical vapor deposition oxide fill and planarization by CMP.

FIG. 12 is a side cross sectional view of the device of FIG. 11 after a chemical vapor deposition oxide fill to deposit a cover oxide layer 102. The deposited cover oxide layer typically is initially deposited to a thickness approximately 1.5 to 2.0 times the thickness of dummy gate layer 94. The wafer is then planarized by chemical mechanical processing, or any other acceptable method, to expose dummy gate 94, as shown in FIG. 12.

Figure 13:
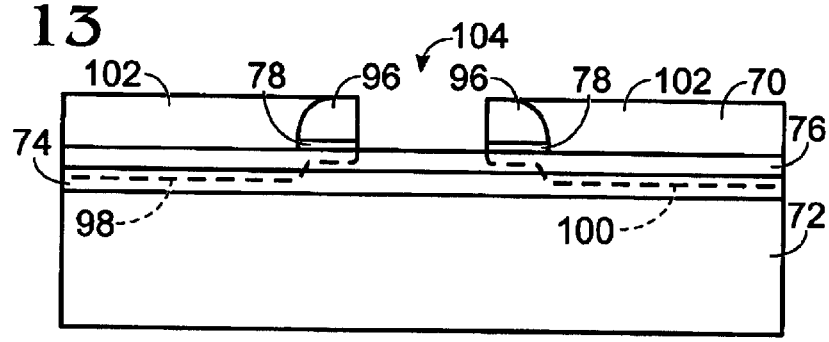
FIG. 13 is a side cross sectional view of the device of FIG. 12 after removal of the dummy gate.

FIG. 13 is a side cross sectional view of the device of FIG. 12 after removal of the dummy gate. The dummy gate 94 typically is then removed by a highly selective etch. The highly selective etch may be conducted by immersion of the substrate in boiling phosphoric acid at a temperature greater than 100 degrees Celsius or a suitable plasma etch process which removes silicon nitride at a rate at least fifty times higher than it removes silicon or silicon dioxide. Care should be taken when removing the dummy gate oxide layer 78 so as to leave a well-controlled silicon cap thickness on top the SiGe channel 74. These process steps will result in a gate "cast" 104 which is ready to receive the final metal gate material.

Figure 14:
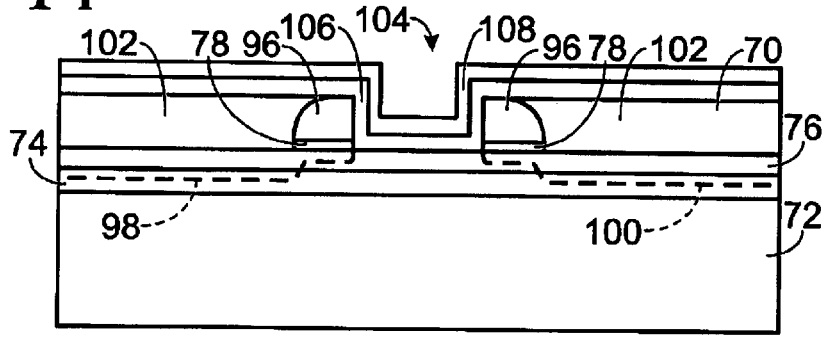
FIG. 14 is a side cross sectional view of the device of FIG. 13 after deposition of the high-k gate dielectric material.

FIG. 14 is a side cross sectional view of the device of FIG. 13 after deposition of the high-k gate dielectric material 106. The dielectric material typically is coated on the sidewalls and the lower surface of cast 104. The high-k dielectric may be deposited using any state of the art process, such as sputtering, chemical vapor deposition (CVD) or atomic layer chemical vapor deposition (ALCVD). The gate dielectric may comprise high dielectric constant materials such as tantalum oxide ($Ta_2O_5$), titanium oxide ($TiO_2$) zirconium oxide ($ZrO_2$), lanthanum oxide ($La_2O_3$), hafnium oxide ($HfO_2$), yttrium oxide ($Y_2O_3$), and their silicates, or other similar materials. Deposition of the high-k dielectric layer 106 typically is followed by the deposition of a thin metal layer 108 which functions as a barrier against metal diffusion there through or to adjust the "turn on" threshold voltage of the device. Layer 108 may comprise Ti, Ta, W or their nitrides, silicides or ternary nitride/silicides, or other metals. Any state of the art process may be used to deposit layer 108, such as CVD, or ALCVD. In some applications, layer 108 may not be necessary.

Figure 15:
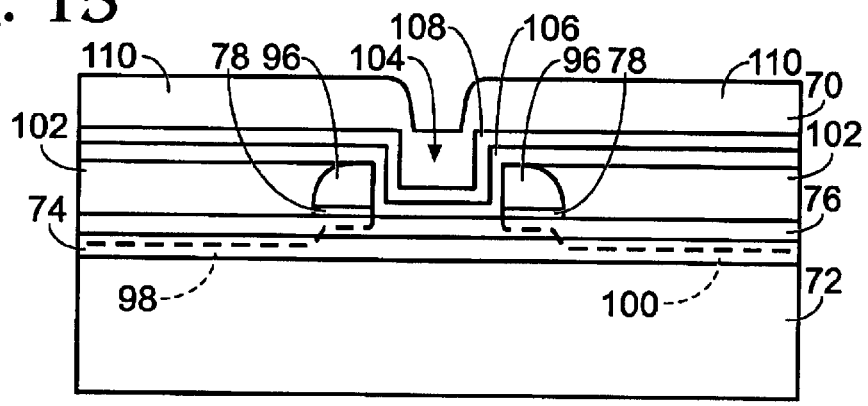
FIG. 15 is a side cross sectional view of the device of FIG. 14 after deposition of the metal gate material.

FIG. 15 is a side cross sectional view of the device of FIG. 14 after deposition of the metal gate material 110. Metal layer 110 may comprise Pt, W, TiN, Cu, Ir, Ti, Zr, Hf, Ta, TaN, WN and/or Al, or any other suitable material and may be deposited by any known process. The thickness of deposited layer 110 typically is greater than the depth of gate cast region 104 such that the gate cast region is completely filled with metal material.

Figure 16:
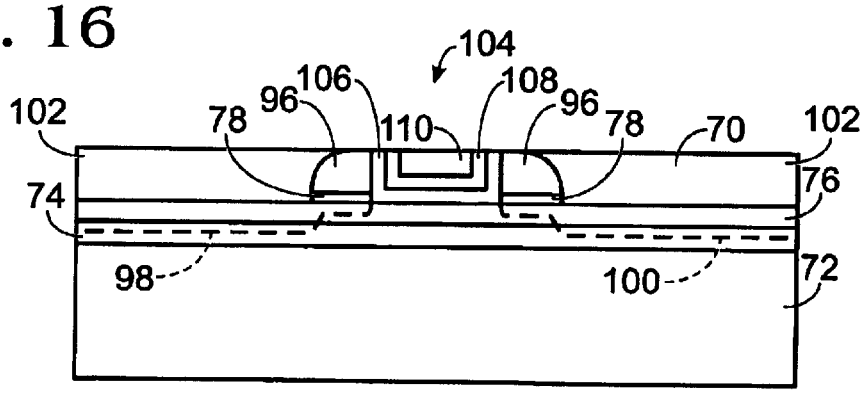
FIG. 16 is a side cross sectional view of the device of FIG. 15 after chemical mechanical polishing of the device.

FIG. 16 is a side cross sectional view of the device of FIG. 15 after chemical mechanical polishing of the device. This process step will remove the excess metal gate material, excess barrier metal layer material and excess high-k dielectric material, stopping at the oxide, to leave a flat upper surface of device 70. The device is now ready for the fabrication of contacts, as known in the art.

Thus, an integrated circuit metal oxide semiconductor transistor and a method of manufacturing the same and, more particularly, a gate replacement process conducted after high temperature treatment of the device so as to minimize diffusion of germanium into the gate dielectric material, has been disclosed. Although preferred structures and methods of manufacturing the device have been disclosed, it should be appreciated that further variations and modifications may be made thereto without departing from the scope of the invention as defined in the appended claims.

We claim:

1. An integrated circuit metal oxide semiconductor transistor comprising:

an active region including a gate positioned between a source and a drain;

a silicon germanium layer incorporated into the active region; and a dielectric layer aligned with said gate and positioned between said gate and said silicon germanium layer, wherein said dielectric layer is formed after thermal processing of said transistor such that said dielectric layer is substantially free of germanium diffused therein from said silicon germanium layer.

2. The transistor of claim 1 wherein said dielectric layer includes less than one percent germanium.

3. The transistor of claim 1 wherein said dielectric layer has a thickness in a range of zero to 100 nm.

4. The transistor of claim 1 wherein said dielectric layer is manufactured of a material chosen from the group consisting of tantalum oxide ($Ta_2O_5$), titanium oxide ($TiO_2$) zirconium oxide ($ZrO_2$), lanthanum oxide ($La_2O_3$), hafnium oxide ($HfO_2$) yttrium oxide ($Y_2O_3$), and their silicates.

5. The transistor of claim 1 wherein said silicon germanium layer comprises $Si_{1-x}Ge_x$, wherein x is in a range of 0.05 to 1.0, and wherein said silicon germanium layer has a thickness in a range of 2 nm to 5 $\mu$m.

6. The transistor of claim 1 wherein said gale is manufactured of a material chosen from the group consisting of Pt, W, TiN, Cu, Ir, Ti, Zr, Hf, Ta, TaN, WN and Al.

7. The transistor of claim 1 further comprising a silicon cap layer positioned between said silicon germanium layer and said dielectric layer.

* * * * *